United States Patent [19]

Chu et al.

[11] 4,212,023
[45] Jul. 8, 1980

[54] BILATERAL PHOTOTRANSISTOR

[75] Inventors: Hing C. Chu, Liverpool; William H. Sahm, III, Syracuse, both of N.Y.; Robert I. Chen, Beaverton, Oreg.

[73] Assignee: General Electric Company, Auburn, N.Y.

[21] Appl. No.: 965,098

[22] Filed: Nov. 30, 1978

[51] Int. Cl.² .................... H01L 31/12; H01L 27/14
[52] U.S. Cl. ........................................ 357/19; 357/30; 357/35; 357/36; 357/68
[58] Field of Search .................. 357/30, 19, 36, 35, 357/68

[56] References Cited
U.S. PATENT DOCUMENTS

| 3,794,891 | 2/1974 | Takamiya | 317/235 R |
| 3,896,475 | 7/1975 | Bonis | 357/35 |
| 3,958,264 | 5/1976 | Magdo | 357/30 |
| 4,107,721 | 8/1978 | Miller | 357/30 |

*Primary Examiner*—Martin H. Edlow
*Attorney, Agent, or Firm*—Robert J. Mooney; Stephen B. Salai

[57] ABSTRACT

A bilateral optically coupled phototransistor includes an infrared emitting diode coupled with a light sensitive transistor. The transistor includes symmetrical interdigitated emitter and collector regions separated by a light sensitive base. Diffused, epitaxial and thermal gradient migration structures are described. Applications are illustrated for variable resistor and analog switch modes of operation.

19 Claims, 11 Drawing Figures

SMALL SIGNAL V-I CHARACTERISTICS

LARGE SIGNAL V-I CHARACTERISTICS

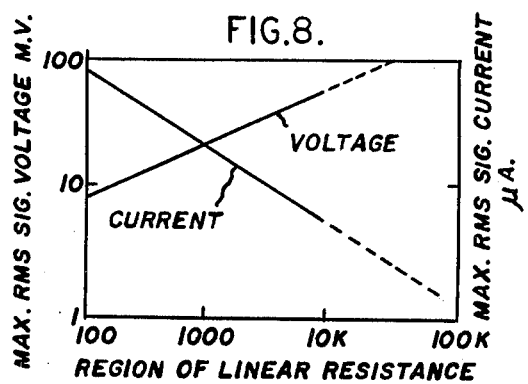
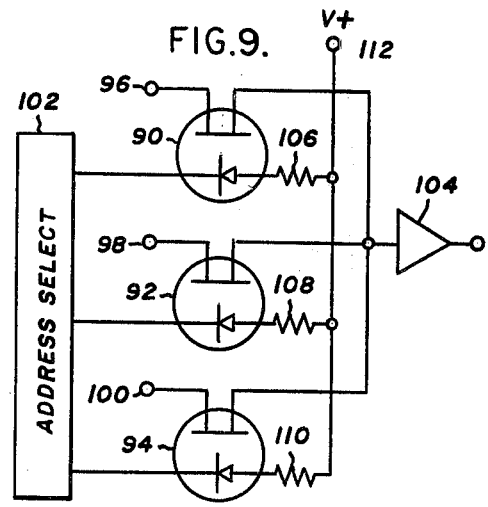
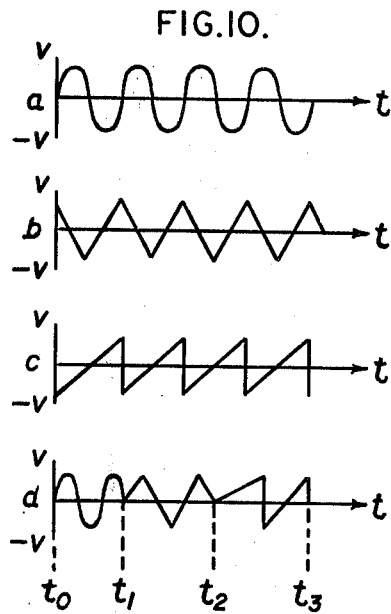
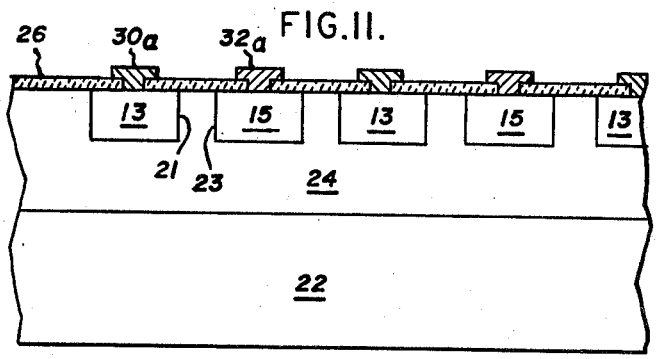

BILATERAL PHOTOTRANSISTOR

This invention relates in general to transistor devices and more particularly to an optically coupled symmetrical transistor.

Optically coupled semiconductor devices, that is to say, devices where the output is electrically isolated from the input and control is accomplished by an optical link, provide a class of devices offering unique advantages in many circuit applications. They are usefully employed to provide electrical isolation in circuits where a control portion operates at different electrical potential than a controlled portion. They provide great flexibility and are widely employed.

Many different optically coupled devices are currently available. Switching devices such as SCR's, triacs, and other thyristors are available in optically coupled versions. Similarly, optically coupled transistors are available which are useful in many applications. As is true of nonoptically coupled transistors, optically coupled transistors have heretofore been able to block voltage and exhibit useful gain for only one polarity of applied bias; they also have significant saturation voltage, that is to say, voltage drop in the "on" state. It is very useful to be able to provide a switching circuit element which is able to block in the off state and pass current in the on state, for both polarities of bias and signal applied to the switch elements. Electro-mechanical switches such as dry reed switches and mercury-wetted relays provide the desired isolation as well as the necessary switching characteristics. They are, however, bulky and expensive compared to solid state devices and are, in addition, substantially slower in speed of operation and tend to be less reliable than solid state devices. It is desirable, therefore, to provide a solid state equivalent of a mechanical switch which combines the desirable qualities thereof with the advantage of solid state construction, providing a switch which has low on-state resistance, high off-state resistance, linear operation in the range of signals switched thereby, high speed, bilateral characteristics, and the like.

Accordingly, it is an object of this invention to provide a bilateral optically coupled transistor which functions to block voltage and to pass current for both polarities of applied signals with substantial symmetry.

It is another object of this invention to provide a bilateral optically coupled transistor which has a very high ratio of off-state resistance to on-state resistance.

It is yet another object of this invention to provide a bilateral, optically coupled transistor having extremely low distortion over a wide range of input signal levels.

It is still another object of this invention to provide a bilateral, optically coupled transistor which when utilized as an AC switch provides a high degree of linearity and low offset voltage.

These and other objects and advantages of the instant invention are obtained in a presently preferred embodiment thereof wherein an emitter region is formed on a first surface of a semiconductor substrate which is preferably an n-type substrate and said emitter region is a p-type region. A collector region is formed on said substrate which is laterally spaced from the emitter region and symmetrical thereto with respect to a base region disposed between said collector region and said emitter region. The collector-base junction of the devie is responsive to radiation impinging thereon to control the conduction of the symmetrical transistor thus formed.

In accordance with a presently preferred embodiment of the invention, the collector and emitter regions are highly interdigitated and are generally comb-shaped, each having a spine from which extends a plurality of relatively thin fingers which are interleaved with a like plurality extending from the spine of the other region of the device. Symmetrical emitter and collector regions provide the bilateral operating characteristics of the device and contribute to the extremely good linearity of the device for AC signals within the dynamic range thereof. In accordance with a presently preferred embodiment of the invention, a light emitting diode is disposed above the interdigitated finger portions of the collector and emitter of the transistor and spaced apart therefrom by a dielectric layer which is preferably some combination of an oxide layer and a glass layer.

In accordance with another embodiment of this invention, improved operation may be achieved by forming the collector and emitter regions by epitaxial techniques to provide collector-base and base-emitter junctions which are substantially vertical and which are more efficient for light fired operations.

In accordance with yet another embodiment of this invention, thermal gradient zone melting (TGZM) is employed to form almost ideal vertical junctions for the collector and emitter regions.

The features of the invention which are believed to be novel are pointed out with particularity in the appended claims.

The invention itself, however, both as to its organization and method of operation together with further objects and advantages thereof may best be understood by reference to the following description taken in connection with the accompanying drawings in which:

FIG. 8 is a graphical representation of the region of linear resistance of a device in accordance with this invention;

FIG. 9 is a schematic diagram of a multiplex circuit utilizing devices in accordance with this invention;

FIG. 10 is a graphical representation of the input and output waveforms of the circuit of FIG. 9;

FIG. 11 is a section view of another embodiment of this invention showing a section corresponding to that of FIG. 2.

Figure 1:
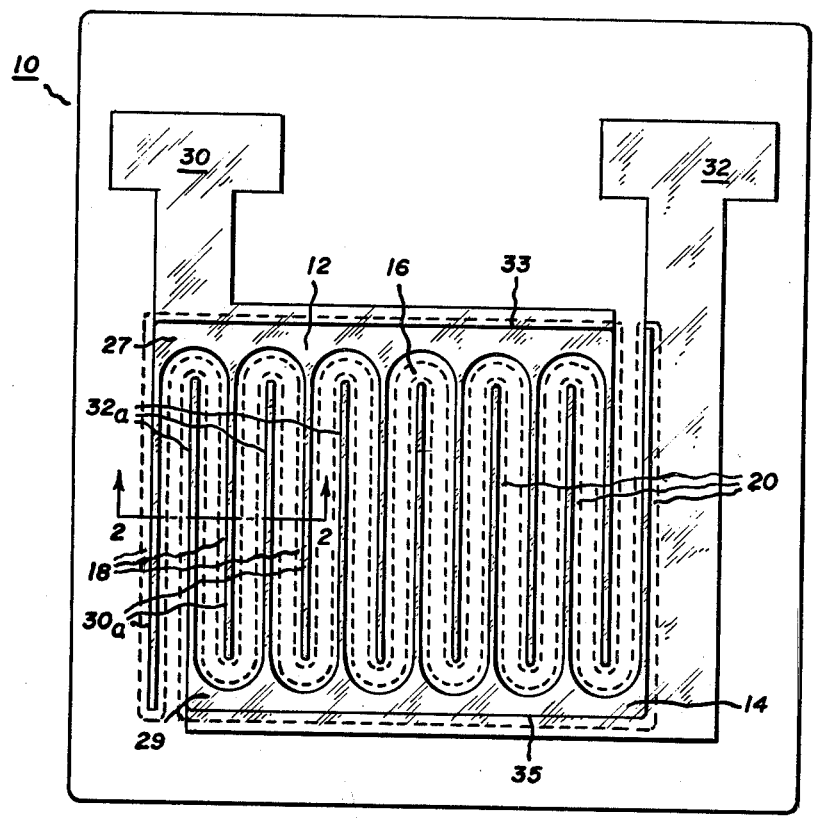
FIG. 1 is a top view of an optically coupled bilateral transistor in accordance with this invention.
Figure 2:
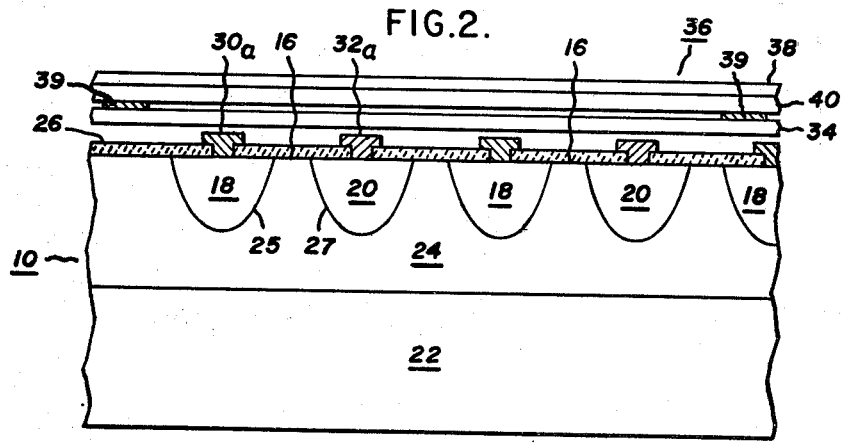
FIG. 2 is a section view of a portion of the device of FIG. 1.

FIGS. 1 and 2 illustrate a top view and a section view, respectively, of a bilateral optically coupled transistor in accordance with a presently preferred embodiment of this invention. Referring now to FIGS. 1 and 2, it will be observed that emitter region 12 which is defined by a phantom line inasmuch as it is hidden in a top view and collector region 14, likewise defined by a phantom border, like reference numerals being used throughout the several figures to designate the elements, are symmetrically disposed with respect to base region 16. Emitter region 12 and collector region 14 are to some extent arbitrarily named inasmuch as they are substantially identical and either could appropriately be considered to be the collector or the emitter. Emitter 12 includes a plurality of fingers 18 which extend toward and are interdigitated with a like plurality of fingers 20 of collector 14. FIG. 2 is a section view through the line 2—2 of FIG. 1 which shows several collector and emitter fingers in cross section. In order to more clearly show the structure of the device, only a few of the collector and the emitter fingers are illustrated in FIG. 2. It is to be understood that FIG. 2 is only a partial section of the device of FIG. 1.

The device of FIG. 2 may be formed on an n-plus conductivity type substrate 22 which is preferably of about 0.01 $\Omega$-cm resistivity single crystal silicon. Base layer 24 is also n-conductivity type silicon, but it is more lightly doped, having, for example, an impurity concentration of about $10^{15}$ atoms per $cm^3$ and a sheet resistivity therefore of about 1–3 $\Omega$-cm. Base layer 24 is preferably epitaxially grown on the surface of substrate 22. Emitter and collector regions 12 and 14 are preferably of p-type semiconductor material and are formed by diffusion through oxide layer 26. Conventionally, openings may be formed in oxide layer 26 by photolithographically masking the oxide layer and then etching to remove the oxide in the areas through which diffusion is desired. In accordance with this invention, relatively small openings are preferred in order to provide close spacing between the emitter and the collector. Openings of about 0.3 mils or about 7.6 micrometers will form emitter and collector regions having a width at the surface of the device of about 35 micrometers and a depth of about 16.5 micrometers by standard diffusion processes. Emitter and collector fingers 18 and 20 are laterally spaced apart so as to have a spacing at the surface of base layer 24 of about 6 micrometers, which spacing increases with depth due to the shape of the emitter and collector regions to a maximum at the bottom of the two regions. Preferably, emitter and collector regions 12 and 14 each has an impurity concentration of about $10^{18}$ atoms per $cm^3$ and may be conveniently formed by diffusion. Electrodes 30 and 32 provide contact to emitter region 12 and collector region 14, respectively. In accordance with this invention, electrodes 30 and 32 may conveniently contact the emitter and collector regions through the same holes in the oxide layer through which the diffusions which form the regions are made. Alternatively, where desired, new openings in oxide layer 26 may be provided for providing contact between the collector and emitter and the electrodes. Emitter electrode fingers 30a and collector electrode fingers 32a are preferably sufficiently narrow that they do not substantially interfere with light impinging upon those portions of base region 24 which portions adjoin the surface of the device. Electrodes 30 and 32 overlie oxide layer 26 except in regions 27 and 29 which include contact fingers 30a and 32a. Boundaries 33 and 35 of the effective electrode areas, those lying on the surface of the silicon device are clearly seen to be symmetrical. While those portions of electrodes 32 and 30 which overlie oxide layer 26 are not symmetrical with respect to each other, they do not affect the symmetry of the active regions of the device.

Radiation for controlling the phototransistor in accordance with this invention is preferably provided by a light emitting diode which may be an infrared emitting diode spaced apart from transistor 10 by dielectric layer 34, which may conveniently be a glass dielectric layer. The thickness of glass dielectric layer 34 may be varied as is well known in order to increase the dielectric strength thereof in order to provide the degree of electrical isolation between radiation source 36 and phototransistor 10. Diode 36 may include a p-type layer 38 and an n-type layer 40 to which contacts are made in a conventional manner as is well understood by those skilled in the art.

One advantageous method for making electrical connection to diode 36 is to form a pattern of metallization 39 on glass dielectric layer 34 for contacting n-type layer 40 and to metallize p-type layer 38 for ready attachment of a conventional lead thereto.

Optically coupled bilateral transistor 10 and diode 36 are preferably encapsulated in a material which will protect them from the operating environment. Preferably, a clear dielectric encapsulant is employed, for example, silicone rubber which may advantageously be surrounded by a reflective layer so as to enhance the transmission of light between the emitter 36 and light responsive transistor 10.

FIG. 11 is another section view analogous to that of FIG. 2 but omitting light emitting diode 36 and dielectric layer 34 which illustrates the structure of a phototransistor, in accordance with this invention, having essentially vertical junctions. Substrate 22 and base layer 24 may be formed in the same way as has been heretofore described in conjunction with FIG. 2.

Emitter regions 13 and collector regions 15 may be formed by preferentially etching the surface of base layer 24 and epitaxially refilling the etched portions with p-conductivity type silicon. Alternatively, regions 13 and 15 may be formed by thermal gradient zone melting as is well known to those skilled in the art (see U.S. Pat. No. 3,988,770). Electrodes 30 and 32 are identical to the like number electrodes in FIG. 2. The structure of FIG. 11 offers certain advantages in sensitivity over that of FIG. 2 at the expense of slightly increased difficulty of fabrication. Vertical junctions 21 and 23, for example, provide more efficient carrier generation on the application of a light signal than do the diverging junctions 25 and 27 of FIG. 2.

Figure 3:
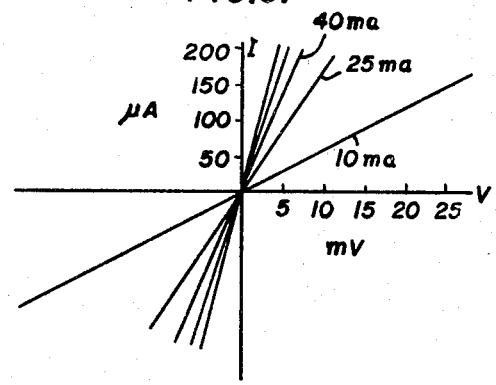
FIG. 3 is a graphical representation of the small signal voltage-current characteristics of a device in accordance with this invention.
Figure 4:
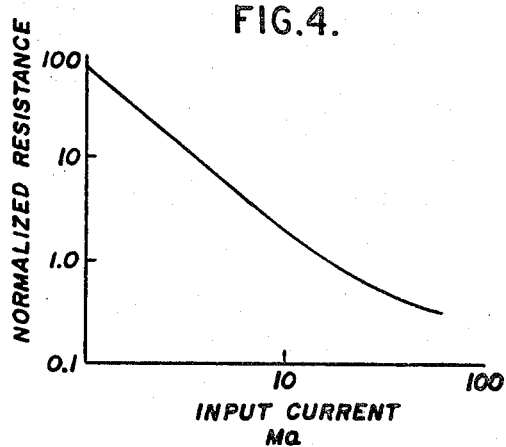
FIG. 4 is a graphical representation of the relation between series resistance and driving current of a device in accordance with this invention.

Reference to FIGS. 3 and 4 provides an understanding of the characteristics of the new optically coupled bilateral transistor.

FIG. 3 graphically illustrates the small signal voltage current (V-I) characteristics of the device as a function of diode current. It will be observed that the characteristics are essentially linear in the range of voltage and current of interest. The device acts as a variable resistor; the resistance depending on the amount of light falling on the base region, varying from about 20 ohms to hundreds of megohms. The higher resistances are achieved with the lowest amount of light.

FIG. 4 is a graphical representation of the resistance as a function of driving current of the light emitting diode. It will be appreciated that the device offers an extremely wide range of resistance and may be employed in relatively simple circuits to achieve a dynamic range in excess of 50 dB with linearity of at least 99.9%.

Figure 5:
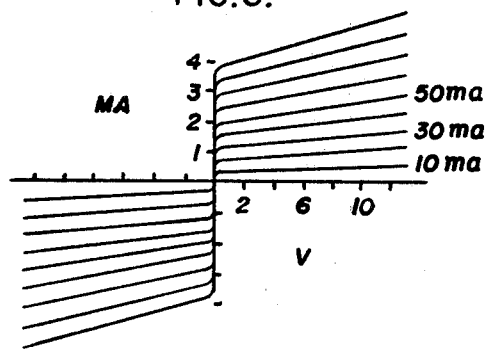
FIG. 5 is a graphical representation of the large signal voltage-current characteristics of a device in accordance with this invention.

FIG. 5 is a graphical representation of the large signal V-I characteristics of this device with LED current as a parameter. The large signal characteristics are those of a light controlled bilateral AC switch. The device will switch AC signals with extremely low offset voltages over a wide range of temperatures; typically, offset voltages of less than 500 µV from 0°-60° C. Additionally, the switching performance is quite good, with rise times of about 5 µsec and fall times of about 4 µsec with a 20 mA IRED signal. This allows repetition rates of up to 20 kHz to be easily accommodated, and high frequency signals (>100 kHz) may be switched.

The small and large signal characteristics of the optically coupled transistor of this invention illustrate that two substantially different modes of operation, each of which fulfills a different need, are possible.

At low signal levels, as exemplified by FIG. 3, voltages on the order of one volt max. and currents on the order of 100 microamps are controlled by the bilateral transistor of this invention; the characteristics are of a linear resistor, the resistance of which varies with the applied light emitting diode current.

The characteristics illustrated are quite usefully employed in low level attenuators, or the like, wherein the linear characteristics along with the isolation provided by the device are important. The resistance of a device in accordance with the instant invention when operated in this mode is illustrated by the graph of FIG. 4. It will be seen that as current through the light emitting diode portion of the device is increased, the resistance decreases while at all times remaining linear within the voltage and current range of interest.

A second, equally useful application for the device in accordance with this invention is as an analog switch. In the switching mode of operation, substantially higher voltage signals may be accommodated by the device, signals having a voltage of 60 volts peak to peak being switchable. Reference to FIG. 5 illustrates that the on-state light emitting diode current is required to be sufficient to insure that the output current required from the device is available. Typically, where the device is used in high impedance circuits requiring low currents, less light emitting diode current is required to switch from the off to the on state. At high LED currents, on the order of 50 mA, currents as high as about 100 microamps may be provided by the device.

Figure 6:
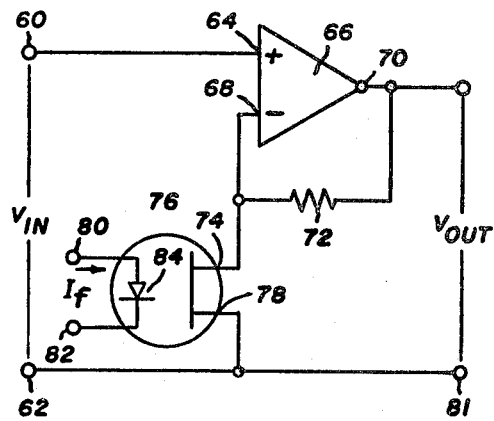
FIG. 6 is a schematic diagram of a variable gain amplifier utilizing a device in accordance with this invention.

Many circuits include functions which are based upon the controllable attenuation of an analog's signal. This type of circuit is very common in audio and communication applications. The application of an optically coupled symmetrical transistor of the type hereinabove described to such a circuit is illustrated at FIG. 6. An input signal, $V_{in}$, is applied to terminals 60 and 62. Terminal 60 is connected to first input 64 of amplifier 66 which may conveniently be an operational amplifier of the integrated circuit variety. Input 64 may be a non-inverting input while second input 68 is an inverting input and is connected to output 70 by feedback resistor 72. Inverting input 68 is also connected to output terminal 74 of bilateral optically coupled transistor 76, second output terminal 78 which is connected to input terminal 62, and output terminal 81 which are the common terminals of the circuit. Terminals 80 and 82 of bilateral optically coupled transistor 76 are internally connected to light emitting diode 84 and connected to a current source (not illustrated) for supplying a current $I_F$ which determines, in combination with resistor 72, the gain of the circuit.

Figure 7:
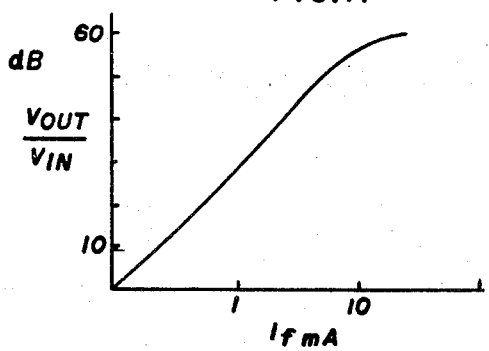
FIG. 7 is a graphical representation of the operating characteristics of the circuit of FIG. 6.

The performance of the attenuator of FIG. 6 is graphically illustrated by the curve of FIG. 7 wherein the gain of the circuit, $V_{out}$ over $V_{in}$, versus the current through light emitting diode 84, $I_F$, is shown. It will be seen therefore that a dynamic range of about 60 dB may be realized.

The level of input signal which may be applied to the circuit of FIG. 6 without distortion is obtained by reference to FIG. 8 which defines the maximum current and voltage of the input signal which remain within the "small signal characteristic region" illustrated at FIG. 3.

The operation of a bilateral, radiation-sensitive transistor in accordance with this invention as an analog switch is illustrated in FIG. 9 wherein a schematic diagram of a simplified signal multiplexer is presented. Three symmetrical, optically coupled transistors 90, 92, and 94 are provided. Input terminals 96, 98, and 100 are adapted to be connected to three signal sources to be multiplexed. The application of an appropriate control signal by address select means 102 energizes one or more of the optically coupled devices to connect one or more of the sources to output amplifier 104. Resistors 106, 108, and 110 allow a ground signal to energize each of the optically coupled transistors providing an appropriate operating current through the light emitting diode of the selected coupler, 90, 92, or 94 determined by the magnitude of the resistors and the value of voltage V+ applied to terminal 112. Normally, it is expected that only one of devices 90, 92, and 94 would be energized by applying a ground signal from address select means 102 thereto. The operation of the circuit of FIG. 9 is illustrated by the graphs of FIG. 10. FIGS. 10a, b, and c represent the signals applied to input terminals 96, 98, and 100, respectively. FIG. 10d graphically illustrates the output of amplifier 104 as a function of time wherein transistor 90 is energized from time $t_0$ to time $t_1$, transistor 92 from time $t_1$ to $t_2$, and transistor 94 from time $t_2$ to time $t_3$. The degree of isolation among the various channels of a multiplex switch of the type illustrated in FIG. 9 is dependent upon the frequency of the input signals applied thereto. Isolation is greatest at low frequency and degrades about 20 dB per decade as the frequency increases. The circuit of FIG. 9 provides about 100 dB isolation among channels at 2 kHz. This isolation may be further increased by careful circuit layout.

While the bilateral optically coupled analog transistor of this invention has been described in accordance with several preferred embodiments thereof, those skilled in the art will recognize that many modifications and changes may be made without departing from the true spirit and scope of the invention. For example, while the device has been described with particular reference to silicon as a semiconductor material, especially for the light sensitive portion thereof, it will be recognized that other semiconductor materials, such as gallium arsenide, or gallium aluminum arsenide, or the like, may be employed by those skilled in the art in order to provide certain particular characteristics. Accordingly, the scope of the invention is intended to be defined by the appended claims.

What is claimed is:
1. A semiconductor device comprising:
   a semiconductor substrate of a first conductivity type having first and second opposed major surfaces;

a first semiconductor layer of the same conductivity as said substrate but characterized by a lower impurity concentration, said first layer epitaxially formed on first major surface;

first and second symmetrical, interdigitated semiconductor regions extending from a top surface of said first semiconductor layer into the bulk of said layer towards but not meeting the boundary between said first layer and said substrate, said first and second regions being of a second conductivity type opposite said first conductivity type; and a radiation sensitive base region disposed between first and second symmetrical interdigitated regions.

2. The device of claim 1 further comprising a radiation source coupled with said radiation sensitive base region.

3. The device of claim 2 further comprising a layer of radiation transmissive electrically insulating material between said radiation source and said radiation sensitive base region.

4. The device of claim 3 wherein said layer of material comprises a layer of glass.

5. The device of claim 3 wherein said radiation source comprises an infrared emitting diode.

6. The device of claim 5 wherein said first and second symmetrical interdigitated semiconductor regions comprise an emitter region and a collector region, each of said regions comprising a spine portion and a plurality of finger portions, said finger portions of said emitter region extending towards but not meeting said spine portion of said collector region, and said finger portions of said collector region extending towards but not meeting said spine portion of said emitter region; and further, wherein said radiation sensitive base region comprises the surface adjacent portion of said first semiconductor layer interposed between said emitter fingers and said collector fingers.

7. The device of claim 6 further comprising an oxide layer overlying said top surface.

8. The device of claim 7 further comprising first and second electrodes in ohmic contact with said emitter and collector regions, respectively; said first and second electrodes extending through opening in said oxide.

9. The device of claim 8 wherein the width of said electrodes is less than the width of said emitter and collector fingers.

10. The device of claim 9 wherein said first and second symmetrical, interdigitated semiconductor regions comprise regions characterized by substantially vertical side walls.

11. The device of claim 10 wherein said first and second regions comprise epitaxially grown semiconductor regions.

12. The device of claim 10 wherein said regions comprise regions formed by thermal gradient zone melting.

13. A bilateral optically coupled semiconductor device comprising:
a radiation source;
a transparent dielectric medium;
a radiation sensitive transistor optically coupled to said source by said medium, said transistor comprising a first semiconductor layer of a first conductivity type;
emitter and collector regions of a second opposite conductivity type formed on a first surface of said first semiconductor layer, said emitter and collector regions defining therebetween a base region and being symmetrical with respect thereto, said base region comprising the surface adjacent portion of said first semiconductor layer.

14. The device of claim 13 wherein said radiation source comprises a light emitting diode.

15. The device of claim 14 wherein said light emitting diode is an infrared emitting diode.

16. The device of claim 13 wherein said transistor comprises a substrate of a first conductivity type and wherein said base layer comprises an epitaxially formed layer of said first conductivity type on a first surface of said substrate.

17. The device of claim 13 wherein said emitter and said collector regions comprise interdigitated emitter and collector regions.

18. The device of claim 17 wherein said emitter and collector regions comprise comb-shaped regions having a spine portion and a finger portion, the finger portion of said collector region interdigitated with the finger portion of said emitter region.

19. An optically coupled transistor comprising:
a semiconductor substrate of a first conductivity type characterized by a first resistivity;
a base layer of said first conductivity type adjoining a first major surface of said substrate and characterized by a second higher resistivity;
a planar emitter layer of second opposite conductivity type extending from a first major surface of said base layer towards but not meeting said first major surface of said substrate;
a planar collector layer of said second opposite conductivity type extending from said first major surface of said base layer towards but not meeting said first major surface of said substrate, said collector layer being laterally spaced apart from said emitter layer and symmetrical thereto with respect to a surface adjacent light sensitive portion of said base layer defined by said emitter and collector layers;
a transparent dielectric medium overlying said emitter collector and base layers;
a light source overlying said dielectric medium, optically coupled with and electrically isolated from said light sensitive base layer.

* * * * *

UNITED STATES PATENT OFFICE
CERTIFICATE OF CORRECTION

PATENT NO. : 4,212,023
DATED : July 8, 1980
INVENTOR(S) : Chen, et al

It is certified that error appears in the above-identified patent and that said Letters Patent are hereby corrected as shown below:

Column, 7, Claim 1, line 1, after "conductivity", insert -- type --.

line 4, after "on", insert -- said --.

line 12, after "between", insert -- said --.

Claim 8, line 44, change "opening" to -- openings --.

Signed and Sealed this

Seventh Day of October 1980

[SEAL]

Attest:

SIDNEY A. DIAMOND

Attesting Officer

Commissioner of Patents and Trademark